(12) United States Patent
Park et al.

(10) Patent No.: US 9,379,145 B2
(45) Date of Patent: Jun. 28, 2016

(54) DISPLAY APPARATUS AND METHOD OF MANUFACTURING THE SAME

(71) Applicant: Samsung Display Co., Ltd., Yongin, Gyeonggi-Do (KR)

(72) Inventors: Joonyong Park, Gunpo-si (KR); Hyang-Shik Kong, Seongnam-si (KR); Kyungseop Kim, Hwaseong-si (KR); Changoh Jeong, Suwon-si (KR); Hoon Kang, Suwon-si (KR); Jinho Ju, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 14 days.

(21) Appl. No.: 14/572,091

(22) Filed: Dec. 16, 2014

(65) Prior Publication Data

US 2015/0198853 A1    Jul. 16, 2015

(30) Foreign Application Priority Data

Jan. 10, 2014    (KR) .................. 10-2014-0003491

(51) Int. Cl.
*G02F 1/1335* (2006.01)
*H01L 27/12* (2006.01)
*G02F 1/1362* (2006.01)

(52) U.S. Cl.
CPC .......... *H01L 27/1259* (2013.01); *G02F 1/1362* (2013.01); *G02F 1/133502* (2013.01); *H01L 27/124* (2013.01)

(58) Field of Classification Search
CPC .............. G02F 1/133502; G02F 1/133553; G02F 1/133555; G02F 1/136227; G02B 5/0278; G02B 1/111; G02B 5/0242; G02B 1/11

USPC .................................. 349/137, 113
See application file for complete search history.

(56) References Cited

U.S. PATENT DOCUMENTS

| 6,630,972 | B1 | 10/2003 | Shiraishi |
| 2007/0188689 | A1 | 8/2007 | Nakamura |
| 2010/0253605 | A1 | 10/2010 | Inada |
| 2013/0057801 | A1* | 3/2013 | Park .................. G02F 1/133308 349/58 |

FOREIGN PATENT DOCUMENTS

| JP | 05-066393 A | 3/1993 |
| JP | 2001-281645 A | 10/2001 |
| JP | 2006-091060 A | 4/2006 |
| JP | 2008-216315 A | 9/2008 |
| JP | 2012-124194 A | 6/2012 |
| KR | 10-2004-0005040 A | 1/2004 |
| KR | 10-2014-0095944 A | 8/2014 |

* cited by examiner

*Primary Examiner* — Mike Qi
(74) *Attorney, Agent, or Firm* — Knobbe Martens Olson & Bear LLP

(57) ABSTRACT

A display apparatus includes a first substrate to be exposed to external light; a second substrate opposing the first substrate; a gate line arranged over the first substrate such that the gate line is located between the first and second substrates; and an anti-reflective layer. The anti-reflective layer is arranged between the first substrate and the gate line. The anti-reflective layer includes an organic layer and an inorganic layer, and the organic layer includes a light absorber configured to absorb light. The inorganic layer overlaps with the organic layer and has a refractive index smaller than that of the gate line.

20 Claims, 10 Drawing Sheets

DISPLAY APPARATUS AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2014-0003491, filed on Jan. 10, 2014, the entire contents of which are hereby incorporated by reference.

BACKGROUND

The present disclosure relates to a display apparatus, and more particularly, to a display apparatus having an enhanced display quality.

Display apparatuses including display panels that do not autonomously emit light such as liquid crystal displays (LCDs) include backlight assemblies as their components and display images by using light emitted from the backlight assemblies.

The display panel includes a display substrate on which a plurality of pixels are formed, an opposite substrate facing the display substrate, a liquid crystal layer located between the display substrate and the opposite substrate, and a polarizer arranged on the front and rear surfaces of the display panel. The display substrate includes a plurality of signal lines that are electrically connected to a plurality of pixels and transmit various signals, and a plurality of thin film transistors (TFTs) that are electrically connected to the plurality of pixels and the plurality of signal lines.

When the display substrate or the opposite substrate is arranged to be exposed to external light, the external light may be reflected from the plurality of signal lines and the electrodes of the plurality of TFTs formed on the display substrate, and thus, the signal lines and the electrodes may be visible to users. In this case, since the reflected light is visible to the users, the display quality of the display panels may decrease.

SUMMARY

An aspect of the present invention provides a display apparatus having an enhanced display quality.

Another aspect of the present invention also provides a method of manufacturing a display apparatus having an enhanced display quality.

Embodiments of the present invention provide display apparatuses which include a first substrate to be exposed to external light; a second substrate opposing the first substrate; a gate line arranged over the first substrate; and an anti-reflective layer. The anti-reflective layer is arranged between the first substrate and the gate line.

The anti-reflective layer includes an organic layer and an inorganic layer, and the organic layer includes a light absorber configured to absorb light. The inorganic layer overlaps with the organic layer and has a refractive index smaller than that of the gate line.

In other embodiments of the present invention, methods of manufacturing a display apparatus include providing a first substrate; forming an anti-reflective layer over the first substrate; forming a gate line over the first substrate such that the anti-reflective layer is located between the first substrate and the gate line. Then, the first substrate is coupled to a second substrate, the first substrate being to be exposed to external light.

The forming of the anti-reflective layer includes forming an organic layer using a resin, a light absorber and a heat-resistant material; and forming an inorganic layer that has a refractive index smaller than that of the gate line and overlaps with the organic layer.

BRIEF DESCRIPTION OF THE DRAWINGS

The accompanying drawings are included to provide a further understanding of features and aspects of the present invention, and are incorporated in and constitute a part of this specification. The drawings illustrate exemplary embodiments of the present invention and, together with the description, serve to explain principles of the present invention. In the drawings.

DETAILED DESCRIPTION OF EMBODIMENTS

Figure 1:
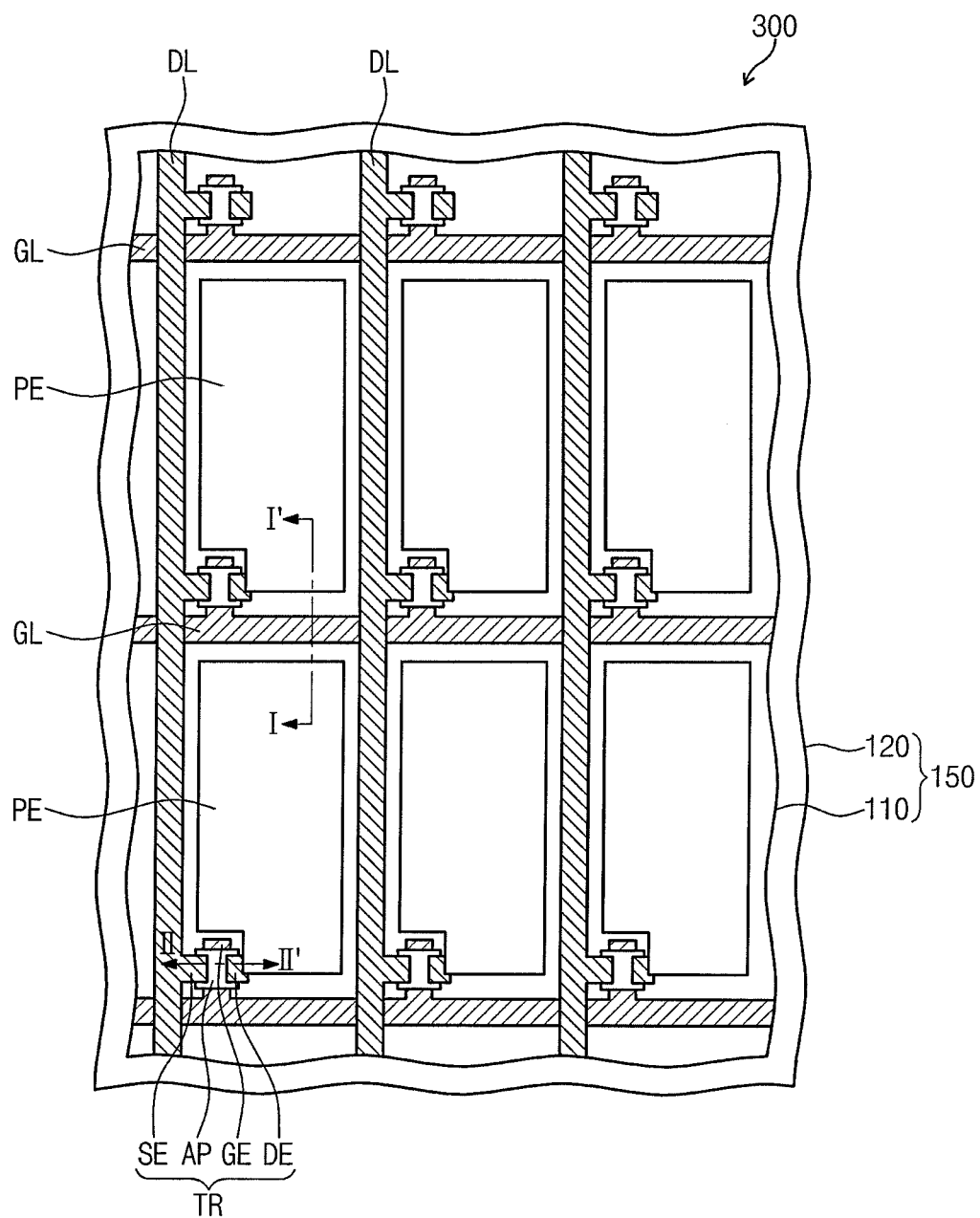
FIG. 1 is a plane view of a display apparatus according to an embodiment of the present invention.

Various embodiments are described below in detail with reference to the accompanying drawings. The above characteristics and effects of the present invention will be easily understood through the following embodiments to be described with reference to the accompanying drawings. However, the present invention is not limited to embodiments to be described below but may be implemented through various applications and variations. Rather, the embodiments of the present invention to be described below are provided to make the technical spirit disclosed herein clearer and fully convey the scope of the present invention to a person skilled in the art. Thus, it should not be construed that the scope of the present invention is not defined by the embodiments to be described below. The same reference numerals denoted in the following embodiments and the accompanying drawings represent the same components.

Also, the terms a first, a second, etc. used herein are not used as limited meanings but used for the purpose of distinguishing one component from another component. Also, when a layer, an area, or component is referred to as being "on" another layer, area, or component, it can be directly on the other layer, area, or component or a third layer, area, or component may also be present.

Figure 2A:
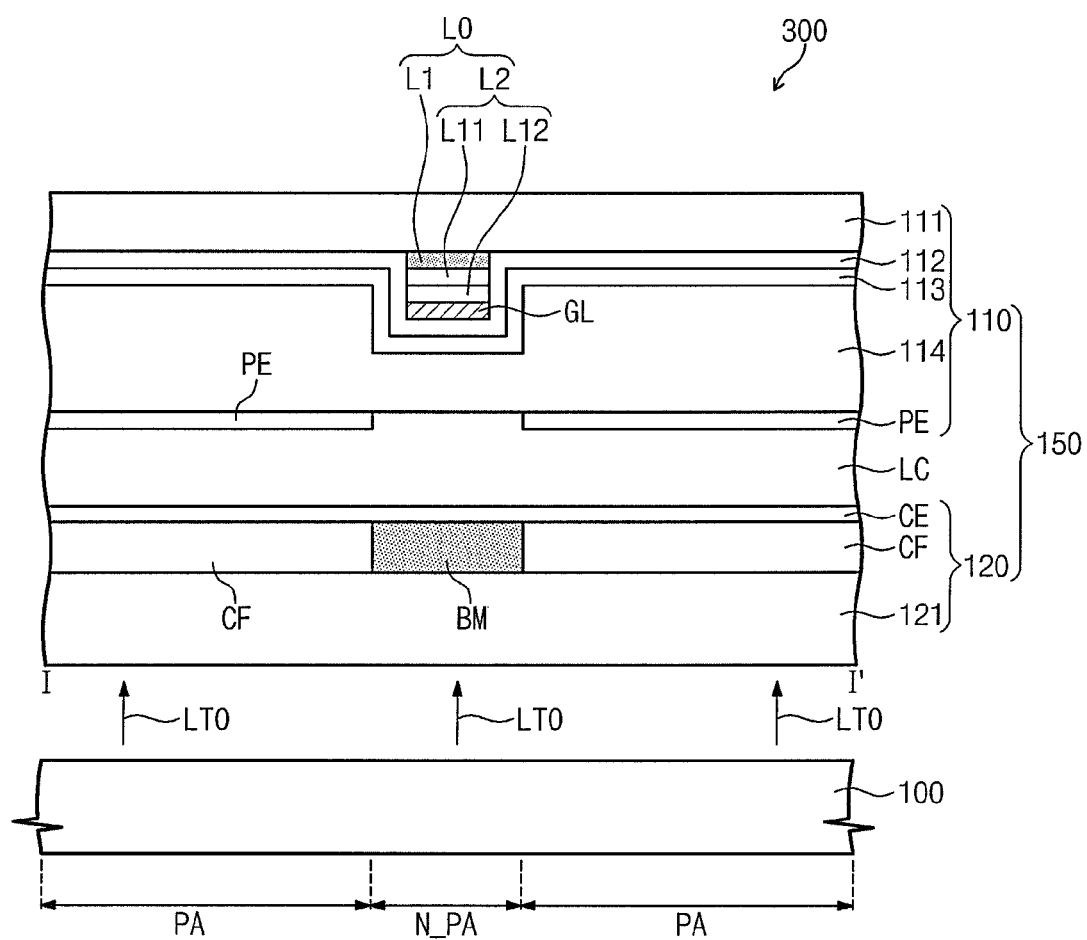
FIG. 2A is a cross-sectional view taken along line I-I' of FIG. 1.
Figure 2B:
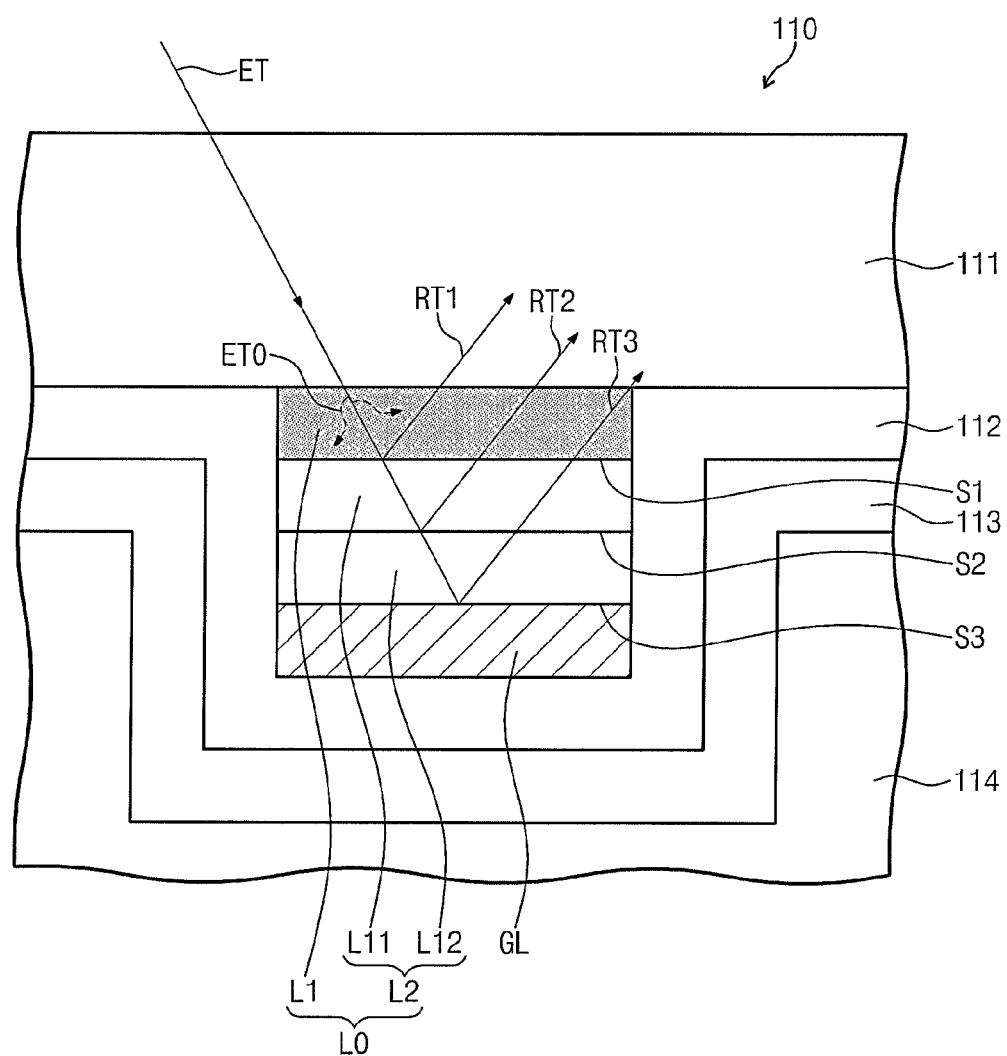
FIG. 2B is an enlarged view of a portion of a display substrate shown in FIG. 2A.

FIG. 1 is a plane view of a display apparatus according to an embodiment of the present invention, FIG. 2A is a cross-sectional view taken along line I-I' of FIG. 1, and FIG. 2B is an enlarged view of a portion of a display substrate shown in FIG. 2A.

Referring to FIGS. 1, 2A and 2B, a display apparatus 300 may be a liquid crystal display (LCD) in the present embodiment. The display apparatus 300 includes a backlight assembly 100 and a display panel 150 which includes a display substrate 110, an opposite substrate 120, and a liquid crystal (LC) layer between the display substrate 110 and the opposite substrate 120. In the present embodiment, the display substrate is exposed to external light ET, and the opposite substrate is arranged between the backlight assembly 100 and the display substrate 110.

The display substrate 110 includes a first substrate 111, a gate line GL, a data line DL, a thin film transistor TR, a pixel electrode PE and an anti-reflective layer L0. As shown in FIG. 1, each of the gate line GL, the data line DL, the thin film transistor TR, and the pixel electrode PE may be provided in plurality.

The first substrate 111 may be a glass or plastic substrate. When the first substrate 111 is the plastic substrate, it may also have a flexible characteristic. The gate line GL is arranged or formed over the first substrate 111, and the data line DL arranged or formed over the gate line GL. The gate line GL and the data line DL is insulated from each other. The thin film transistor TR is electrically connected to the gate line GL and the data line DL, and in the present embodiment, the thin film transistor TR may be located to be adjacent to the intersection of the gate line GL and the data line DL.

The pixel electrode PE is arranged on a pixel area PA. In the present embodiment, the pixel electrode PE is arranged on a second insulating layer 113 and a third insulating layer 114 covering the thin film transistor TR. The pixel electrode PE may be electrically connected to the thin film transistor TR through a contact hole passing through the second insulating layer 113 and the third insulating layer 114.

In embodiments, at least a portion of the external light can reach the gate line and be reflected from the gate line. The anti-reflective layer L0 is arranged between the first substrate 111 and the gate line GL and decreases the amount of the light reflected from the gate line GL. The structure of the anti-reflective layer L0 according to the present embodiment is described below in more detail.

The anti-reflective layer L includes an organic layer L1 and an inorganic layer L2. The organic layer L1 and the inorganic layer L2 are stacked between the first substrate 111 and the gate line GL, and more particularly, the organic line L1, the inorganic layer L2, and the gate line GL are sequentially stacked on the first substrate 111. In an embodiment, the organic layer L1 directly contacts the inorganic layer L2.

The organic layer L1 may include a resin and a light absorber which is more light-absorbent than the resin. In the present embodiment, the light absorber may include carbon. Thus, a portion of the external light ET proceeding to the gate line GL is absorbed and converted into absorption light ET0, and as a result, only portions of the external light ET reaching the gate line GL can be reflected, so it is possible to decrease the amount of the light reflected from the gate line GL.

In the present embodiment, the absorption coefficient of the organic layer L1 may be 0.1 to 2.0. The greater a ratio of weight of the light absorber (wt %) with respect to the weight of the organic layer L1 is, the greater the absorption coefficient of the organic layer L1 is.

Also, in the present embodiment, the organic layer L1 may further include a heat-resistant material in addition to the resin and the light absorber. In embodiments, the heat-resistant material may include siloxane. In an embodiment, a weight reduction ratio of the organic layer L1 may be 0% to about 10% at a temperature of 100° C. to 400° C. by using the heat-resistant material.

The inorganic material L2 is arranged between the organic layer L1 and the gate line GL, and the refraction index of the inorganic layer L2 may be about 1.5 to about 2.0. In the present embodiment, the inorganic layer L2 may include a first sub-layer L11 and a second sub-layer L12, the second sub-layer L12 may be stacked on the first sub-layer L11. In an embodiment, the first sub-layer L11 may be located between the organic layer L1 and the second sub-layer L12, and the second sub-layer L12 may be located between the first sub-layer L11 and the gate line GL.

The refractive index of the second sub-layer L12 may be larger than that of the first sub-layer L11 in the present embodiment. As described above, when the first and the second sub-layers L11 and L12 have the refractive indexes as discussed above, the amount of the external light ET reflected from the gate line GL decrease by using destructive interference as follows.

In the present embodiment, the thickness of the organic layer L1 may be 0.01 μm to 0.50 μm, a portion of the external light ET may be absorbed by the organic layer L1, and other portions of the external light ET may pass through the organic layer L1. In this case, the external light ET reaching the organic layer L1 may be reflected from the first interface S1 between the organic layer L1 and the first sub-layer L11, so first reflected light RT1 may be generated.

The external light ET may pass partially through the first sub-layer L11 and be reflected from the second interface S2 between the first and the second sub-layers L11 and L12, and as a result, second reflected light RT2 may be generated. Also, the external light ET may pass partially through the second sub-layer L12 and be reflected from the third interface S3 between the second sub-layers L12 and the gate line GL, and as a result, third reflected light RT3 may be generated.

When the first to the third reflected light RT1 to RT3 are generated through the above-described path of the external light ET and the thickness of each of the first and the second sub-layers L1 and L2 is set to satisfy Equation 1 below, destructive interference occurs between the third reflected light RT3 and at least one of the first and the second reflected light RT1 and RT2 and the amount of the third reflected light RT3 may thus decrease.

$$(d1+d2) \approx \{(\lambda/4) \times (1/n1)\} + \{(\lambda/4) \times (1/n2)\} \qquad \text{<Equation 1>}$$

In Equation 1, d1 is the thickness of the first sub-layer L11, d2 is the thickness of the second sub-layer L12, λ is the wavelength of the external light ET, n1 is the refractive index of the first sub-layer L11, and n2 is the refractive index of the second sub-layer L12.

In the present embodiment, each of the first sub-layer L11 and the second sub-layer L12 may include at least one of an oxide of a metal, a nitride of a metal, a transparent, conductive oxide, and a metal. In consideration of the wavelength of the external light ET, the thicknesses of the first and the second sub-layers L11 and L12, and the refractive indexes of the first and the second sub-layers L11 and L12, various embodiments of the first and the second sub-layers L11 and L12 are indicated in Table 1 below.

TABLE 1

| Materials (First sub-layer/ Second sub-layer) | Thicknesses (angstrom) (First sub-layer/ Second sub-layer) | Memos |
|---|---|---|
| MoOx/TiNx | 450/150 | First sub-layer includes a metal oxide |
| TiOx/TiNx | 450/200 | |
| AlOx/CuOx | 300/300 | |
| CuOx/TiNx | 450/550 | |
| CuOx/MoNx | 450/200 | |
| SiOx/CuOx | 450/300 | |
| AlNx/TiNx | 450/150 | First sub-layer includes a metal nitride |
| CuNx/SiOx | 200/750 | |
| CuNx/AlOx | 200/600 | |

TABLE 1-continued

| Materials (First sub-layer/ Second sub-layer) | Thicknesses (angstrom) (First sub-layer/ Second sub-layer) | Memos |
|---|---|---|
| CuNx/GZO (GZO = Ga$_2$O$_3$:ZnO = 11.8 wt %:88.2 wt %) | 200/550 | |
| CuNx/AZO | 200/550 | |
| CuNx/IZO | 200/550 | |
| CuNx/SiNx | 200/550 | |
| CuNx/GZO | 200/550 | |
| CuNx/IZO | 200/500 | |
| CuNx/MoOx | 150/500 | |
| CuNx/AlOx | 150/400 | |
| CuNx/TiOx | 150/400 | |
| SiNx/CuOx | 150/400 | |
| ITO/AlNx | 150/300 | |
| ITO/CuOx | 200/500 | First sub-layer includes a transparent, conductive material |
| IZO/CuOx | 200/300 | |
| GZO/CuOx (GZO = Ga$_2$O$_3$:ZnO = 11.8 wt %:88.2 wt %) | 150/300 | |
| GZO/CuOx (GZO = Ga$_2$O$_3$:ZnO = 20.4 wt %:79.6 wt %) | 100/300 | |
| AZO/CuOx | 150/300 | |
| Ti/AlNx | 100/300 | First sub-layer includes a metal |
| Ti/GZO | 100/400 | |
| GZO/CuOx (GZO = Ga2O3:ZnO = 20.4 wt %:79.6 wt %) | | |
| Ti/IZO | 100/450 | |
| Ti/MoOx | 100/300 | |
| Ti/TiOx | 100/300 | |

As described in detail above, when the function in which the organic layer L1 absorbs the external light ET by the light absorber is defined as a first anti-reflective function, and the function in which the inorganic layer L2 decreases the amount of light reflected from the gate lines GL by using destructive interference is defined as a second anti-reflective function, it is possible to prevent the external light ET reflected from the display substrate 110 from being mixed with light representing images on the display apparatus 300 by the first and the second anti-reflective functions by the anti-reflective layer L0, and thus the contrast ratio of the images may be enhanced.

In the present embodiment, the refractive index of the organic layer L1 may be 1.5 to 2.0, and the refractive index of the organic layer L1 may be smaller than that of the inorganic layer L2. Thus, when the external light ET is partially reflected from the interface between the first substrate 111 and the organic layer L1, the amount of the third reflected light may further decrease by destructive interference between the light reflected from the interface between the first substrate 111 and the organic layer L1 and the third reflected light RT3.

The refractive index of the organic layer L1 may be adjusted by the light absorber (wt %) that the organic layer L1 includes. More particularly, as shown in Table 2 below, as the light absorber (wt %) included in the organic layer L1 decreases, the refractive index of the organic layer L1 decreases.

TABLE 2

| Carbon content (wt %) of organic layer | Refractive index of organic layer (wavelength of external light = 633 nm) |
|---|---|
| 10 | 1.58 |
| 30 | 1.63 |
| 50 | 1.69 |
| 70 | 1.73 |
| 90 | 1.77 |

The opposite substrate 120 may include a second substrate 121, a common electrode CE, a light shielding layer BM, and a color filter CF. The second substrate 121 may be a transparent substrate such as a glass or plastic substrate, and the common electrode CE is formed on the second substrate 121 and forms an electric field controlling the orientation of liquid crystal molecules of the LC layer along with the pixel electrode.

In the present embodiment, the light shielding layer BM is arranged on the second substrate 121 to face the non-pixel area N_PA, and the color filter CF is arranged on the second substrate 121 to face the pixel area PA. In another embodiment, the light shielding layer BM may be arranged on the first substrate 111 to face the non-pixel area N_PA, and the color filter CF may be arranged on the first substrate 111 to face the pixel area PA.

The backlight assembly 100 outputs light LT0 to the display panel 150, and the display panel 150 receives the light LT0 and displays images. The backlight assembly 100 is arranged adjacent to the opposite substrate 120 such that the opposite substrate is located between the back light and the display substrate 110. The backlight assembly 100 may include a light-emitting unit (not shown) and a light guide plate that guides light generated from the light-emitting unit to the display panel 150, but the present invention is not limited to a structure of the backlight assembly 100.

Figure 3:
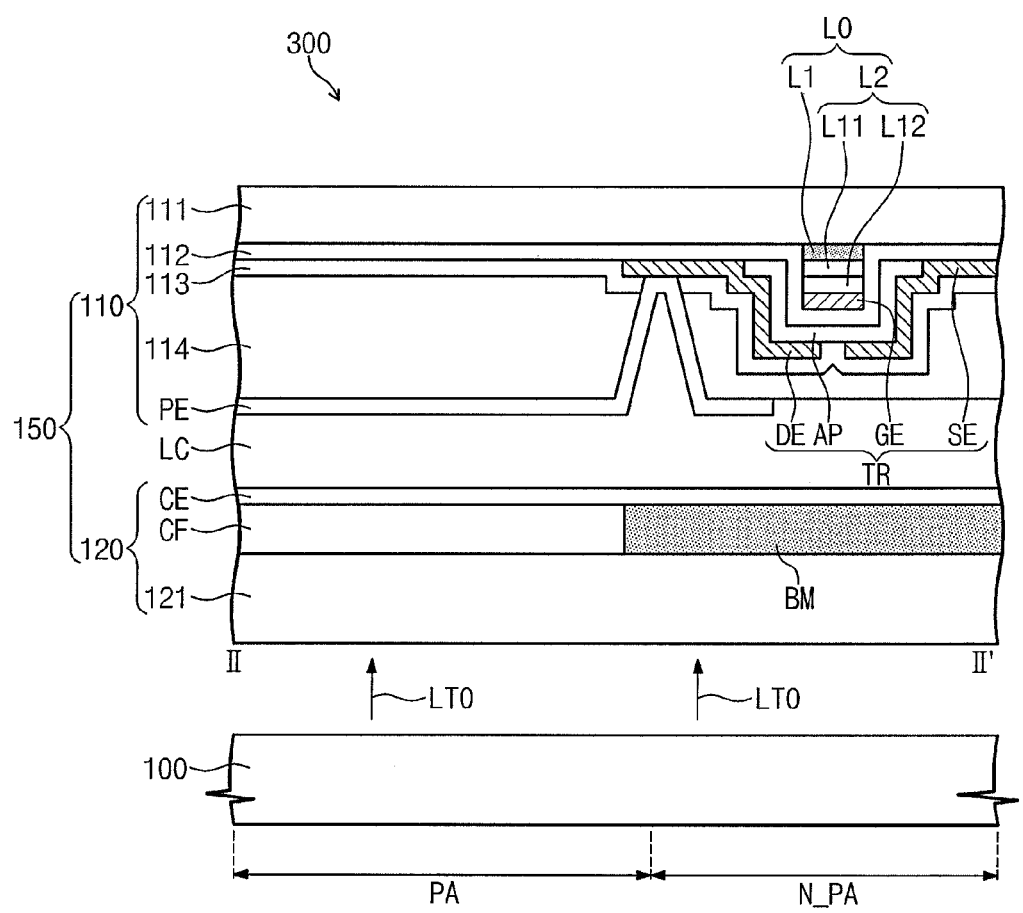
FIG. 3 is a cross-sectional view taken along line II-II' of FIG. 1.

FIG. 3 is a cross-sectional view taken along line II-II' of FIG. 1.

Referring to FIG. 3, the thin film transistor TR may be arranged in the non-pixel area N_PA, and the thin film transistor TR may include a gate electrode GE, an active pattern AP, a source electrode SE and a drain electrode DE.

The gate electrode GE is electrically connected to the gate line (GL of FIG. 1) and arranged on the first substrate 111, and the active pattern AP is arranged over the gate electrode GE on which a first insulating layer 112 is located. The source electrode SE is electrically connected to the data line (DL of FIG. 1) and arranged on the active pattern AP, and the drain electrode DE is spaced apart from the source electrode SE and arranged on the active pattern AP.

In the present embodiment, the active pattern AP may include a semiconductor material such as amorphous silicon. However, the present invention is not limited to the semiconductor material that the active pattern AP includes. In other embodiments, the active pattern AP may also include an oxide semiconductor such as an IGZO, ZnO, SnO$_2$, In$_2$O$_3$, Zn$_2$SnO$_4$, Ge$_2$O$_3$ or HfO$_2$ semiconductor or may include a compound semiconductor such as a GaAs, GaP or InP semiconductor.

The anti-reflective layer L previously described with reference to FIGS. 2A and 2B may be further arranged between the gate electrode GE and the first substrate 111. The anti-reflective layer L0 includes the organic layer L1 and the inorganic layer L2 which includes the first sub-layer L11 and the second sub-layer L12, and in this case, the organic layer L1, the first sub-layer L11, the second sub-layer L12, and the gate electrode GE are sequentially stacked on the first substrate 111.

As the anti-reflective layer L0 is arranged between the first substrate 111 and the gate electrode GE, the amount of the external light reflected from the gate electrode GE may decrease by the first and the second anti-reflective functions of the anti-reflective layer L0 that are previously described with reference to FIGS. 1, 2A and 2B. Thus, the contrast ratio of images displayed on the display apparatus 300 may be enhanced.

Figure 4:
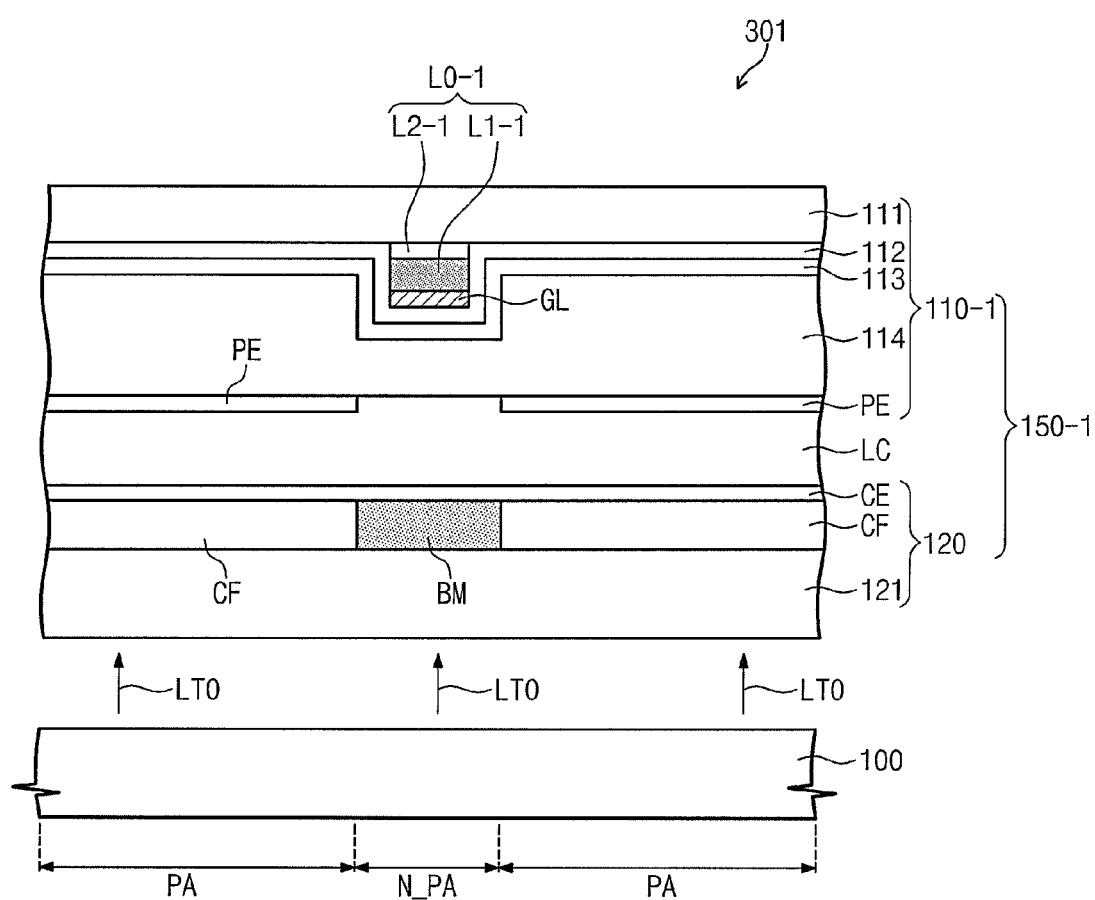
FIG. 4 is a cross-sectional view of a display apparatus according to another embodiment of the present invention.
Figure 5:
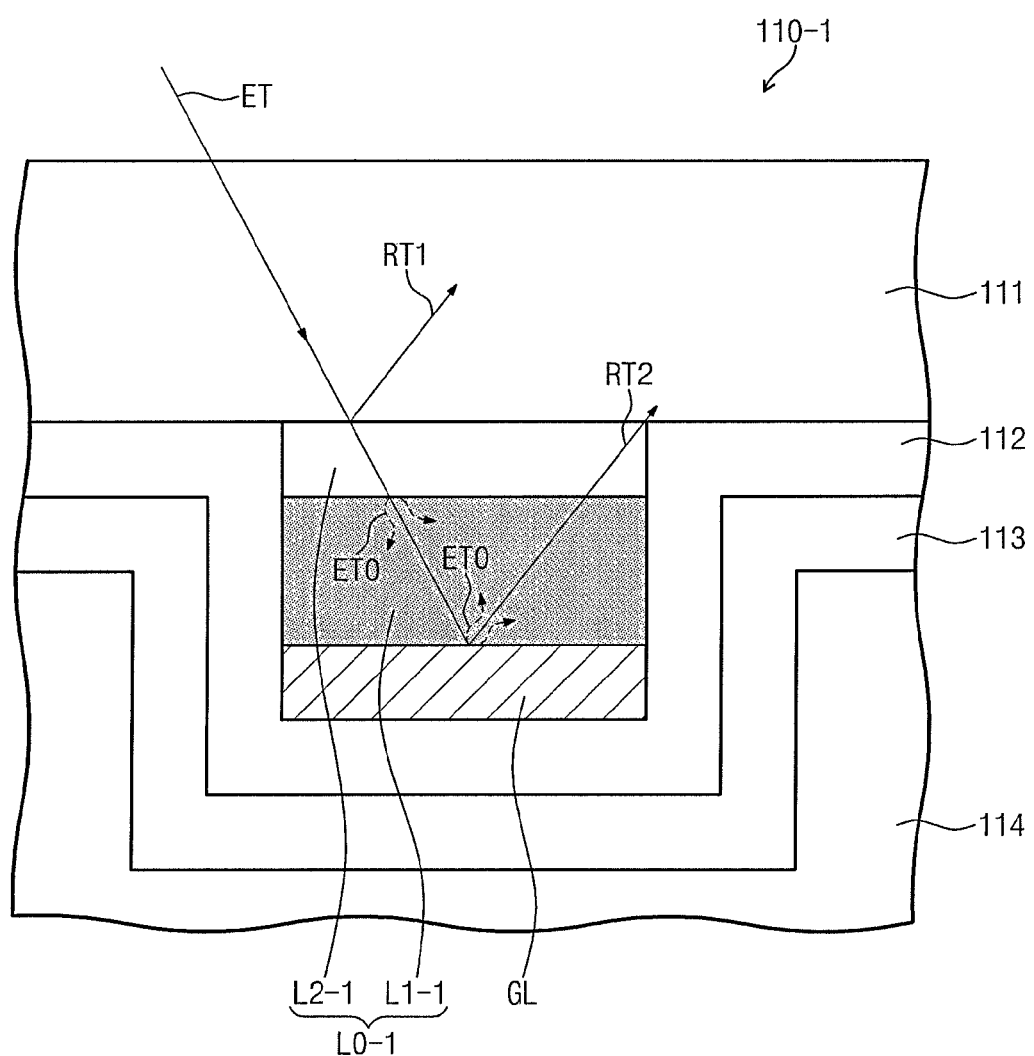
FIG. 5 is an enlarged view of a portion of a display substrate shown in FIG. 5.

FIG. 4 is a cross-sectional view of a display apparatus according to another embodiment of the present invention, and FIG. 5 is an enlarged view of a portion of the display apparatus shown in FIG. 4. In describing FIGS. 4 and 5, the components described above are denoted by the same reference numerals and their detailed descriptions are left out.

Referring to FIGS. 4 and 5, a display apparatus 301 includes a display panel 150-1 which includes a display substrate 110-1 having an anti-reflective layer L0-1; and an opposite substrate 120.

In the present embodiment, the anti-reflective layer L0-1 includes an organic layer L1-1 and an inorganic layer L2-1. The organic layer L1-1 and the inorganic layer L2-1 are stacked between the first substrate 111 and the gate line GL, and more particularly, the inorganic layer L2-1, the organic layer L1-1, and the gate line GL are sequentially stacked on the first substrate 111.

In the present embodiment, the inorganic layer L2-1 may have a single layer shape, and the inorganic layer L2-1 may be at least one of a metal layer, an oxide layer, a nitride layer, an oxide semiconductor layer, and a transparent, conductive layer. The metal layer may include any one of molybdenum (Mo), titanium (Ta), aluminum (Al), and copper (Cu), the oxide layer may include at least one of an oxide of molybdenum (Mo), an oxide of titanium (Ta), an oxide of aluminum (Al), an oxide of copper (Cu) and an oxide of silicon (Si), the nitride oxide may include at least one of a nitride of molybdenum (Mo), a nitride of titanium (Ta), a nitride of aluminum (Al), a nitride of copper (Cu) and a nitride of silicon (Si), and the nitride oxide, the oxide semiconductor layer may include at least one of an indium zinc oxide, (IZO), an indium gallium zinc oxide (IGZO), an indium zinc tin oxide (IZTO), a gallium zinc oxide (GZO), an aluminum zinc oxide (AZO), an indium tin oxide (ITO), a gallium tin oxide (GTO) and a zinc tin oxide (ZTO).

Decrease of the amount of light reflected from the gate line GL using the anti-reflective layer L0-1 having the above-described structure is discussed below.

First, a portion of the external light is reflected from the surface of the inorganic layer L2-1 and generates the first reflected light RT1, and another portion of the external light ET passes through the inorganic layer L2-1 and proceeds to the organic layer L1-1. In this case, the organic layer L1-1 may include a resin, a light absorber, and a heat-resistant material, and as a result, the external light ET entering the organic layer L1-1 changes to the absorption light ET0 as in the previous embodiment.

Also, even if the external light ET is partially absorbed by the organic layer L1-1, the external light ET may partially pass through the organic layer L1-1, and as a result, the external light ET passing through the organic layer L1-1 may be reflected from the gate line GL and the second reflected light RT may be generated. In this case, the amount of the second reflected light RT2 may decrease by the destructive interference between the first and the second reflected light RT1 and RT2 as in the previous embodiment. Also, a portion of the second reflected light RT2 not disappearing by the destructive interference may be absorbed by the organic layer L1-1.

In the embodiment shown in FIG. 2B, the refractive index of the organic layer L1 (of FIG. 2B) may be smaller than that of the inorganic layer L2 (of FIG. 2B) but in the present embodiment, the magnitude of the refractive index of the organic layer L1-1 may not depend on that of the refractive index of the inorganic layer L2-1. Thus, as described with reference to Table 2, it is possible to easily increase the absorption coefficient of the organic layer L1-1 by increasing the weight % of the light absorber contained in the organic layer L1-1 or increasing the thickness of the organic layer L1-1 and increasing the weight of the light absorber, and as a result, the function in which the organic layer L1-1 absorbs the external light ET may be reinforced.

Figure 6:
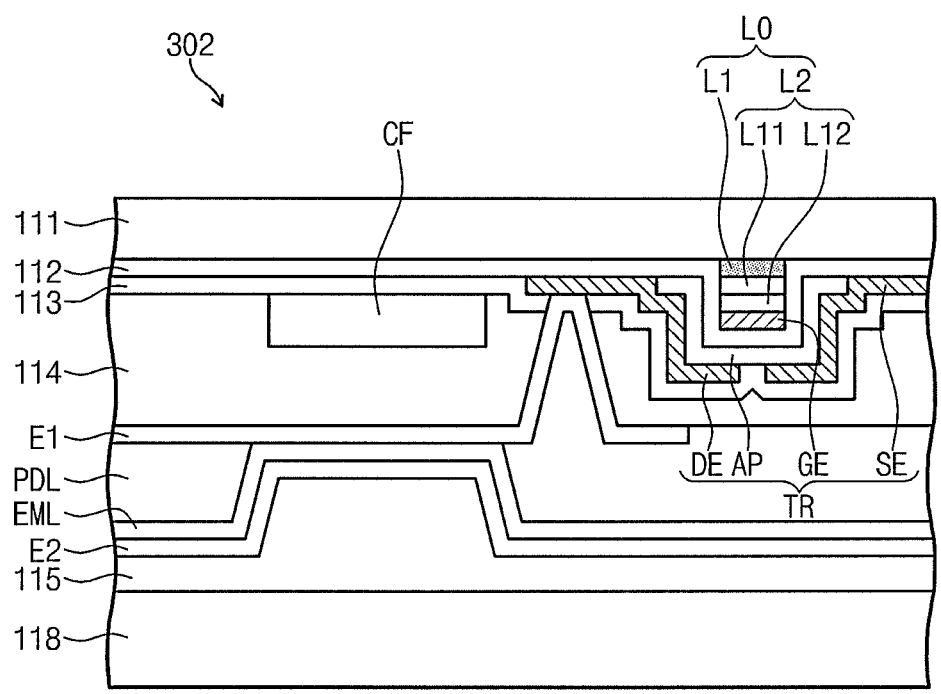
FIG. 6 is a cross-sectional view of a display apparatus according to another embodiment of the present invention.

FIG. 6 is a cross-sectional view of a display apparatus according to another embodiment of the present invention. In describing FIG. 6, the components described above are denoted by the reference numerals and their detailed descriptions are left out.

Referring to FIG. 6, a display apparatus 302 may be an organic electroluminescence display apparatus.

The display apparatus 302 includes the thin film transistor TR, a first electrode E1, an organic emission layer EML, a second electrode E2, and the anti-reflective layer L0.

As previously described with reference to FIG. 3, the anti-reflective layer L0 may be arranged between the gate electrode GE of the thin film transistor TR and the first substrate 111.

Thus, the amount of a reflected light generated by the external light reflected from the gate electrode GE may decrease by the anti-reflective layer L0.

The first electrode E1 is electrically connected to the drain electrode DE of the thin film transistor TR. A pixel definition layer PDL is arranged on the third insulating layer 114, and the organic emission layer EML is arranged on the pixel definition layer PDL and is in contact with the first electrode E1 through an opening formed in the pixel definition layer PDL. Also, the second electrode E2 is arranged on the organic emission layer EML and generates an electric field for emitting light from the organic emission layer EML along with the first electrode E1. An encapsulation layer 115 covers the second electrode E2 to encapsulate the organic emission layer EML, and a second base substrate 118 is arranged to face the first substrate 111. There is the encapsulation layer 115 between the substrates.

Figure 7A:
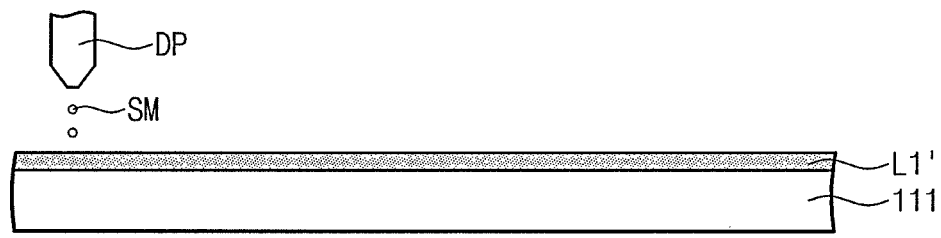
FIGS. 7A to 7F represent a method of manufacturing a display apparatus shown in FIG. 3.

FIGS. 7A to 7F represent a method of manufacturing a display apparatus shown in FIG. 3. In describing FIGS. 7A to 7F, the components described above are denoted by the same reference numerals and their detailed descriptions are left out. Referring to FIG. 7A, the extra organic layer L1' is formed on the first substrate 111. In the present embodiment, the source material SM may be provided onto the first substrate 111 by using a dispersion unit DP, and the provided source material SM may be cured to form the extra organic layer L1'.

In the present embodiment, a source material SM may be formed by mixing a resin with a light absorber and a heat-resistant material, the light absorber may include carbon, and the heat-resistant material may include siloxane. In this case, as the light absorber (wt %) mixed with the resin increases, the refractive index of an extra organic layer L1' may increase, as previously described with reference to Table 2. Also, as the light absorber (wt %) mixed with the resin increases, the absorption coefficient of the extra organic layer L1' may increase. Thus, it is possible to easily adjust the refraction index and absorption coefficient of the extra organic layer L1' by adjusting the content of the light absorber contained in the resin.

In other embodiments, the extra organic layer L1' may be formed by providing the source material SM onto the first substrate 111 by using another method such as slit coating or spin coating.

Figure 7B:
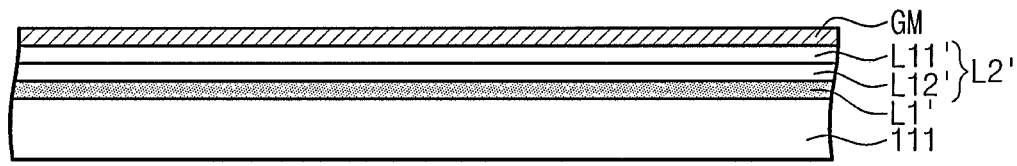
Figure 7C:
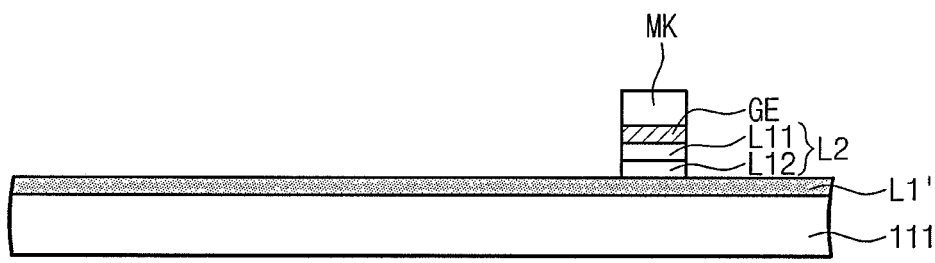

Referring to FIGS. 7B and 7C, an extra inorganic layer L2' is formed on the first extra layer L1' and a gate metal layer GM is formed on the extra inorganic layer L2'. The extra inorganic layer L2' may be formed by stacking a first layer L11' and a second layer L12' on the extra organic layer L1'. In the present embodiment, the extra inorganic layer L2' and the gate metal layer GM may be formed by using sputtering and deposition such as chemical vapor deposition (CVD).

Then, a mask pattern MK is formed on the gate metal layer GM, and the gate metal layer GM and the extra inorganic layer L2' are sequentially patterned by using the mask pattern MK as a mask. As a result, the gate electrode GE is formed, the inorganic layer L2 including the first sub-layer L11 and the second sub-layer L12 is formed, and a portion of the extra layer L1' is externally exposed.

Figure 7D:

Referring to FIG. 7D, the organic layer L1 is formed by removing the externally exposed portion of the extra organic layer L1' (of FIG. 7C), and the mask pattern MK is removed. As a result, the anti-reflective layer L0 is formed in which the organic layer L1 is stacked on the first substrate 111, and the inorganic layer L2 is stacked on the organic layer L1.

Figure 7E:
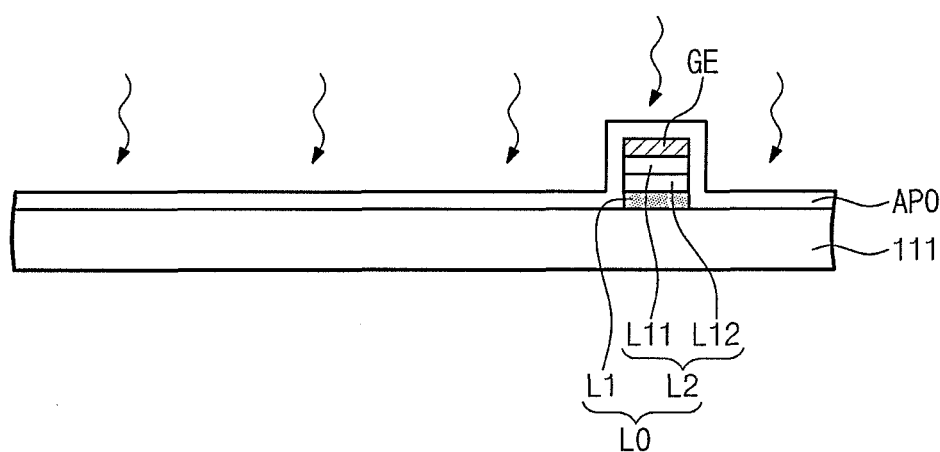

In the present embodiment, it is possible to perform ashing on the mask pattern MK and the externally exposed portion of the extra organic layer L1' by using a plasma process. In the present embodiment, in order to decrease a time needed for the ashing, the thickness of the extra organic layer L1' may be 0.01 um to 0.50 um. Referring to FIG. 7E, an extra active layer AP0 is formed on the second substrate 111 on which the gate electrode GE and the anti-reflective layer L0 are formed. In the present embodiment, the extra active layer AP0 may be formed by depositing amorphous silicon on the first substrate 111 by using CVD.

While the extra active layer Ap0 is formed, the organic layer L1 is exposed to a process temperature of 300 C to 400 C and the shape and weight of the organic layer L1 may thus be affected by the process temperature. However, as previously described, since the organic layer L1 includes a heat-resistant material, the weight reduction ratio of the organic layer L1 at the process temperature may be 0% to 10%.

Figure 7F:
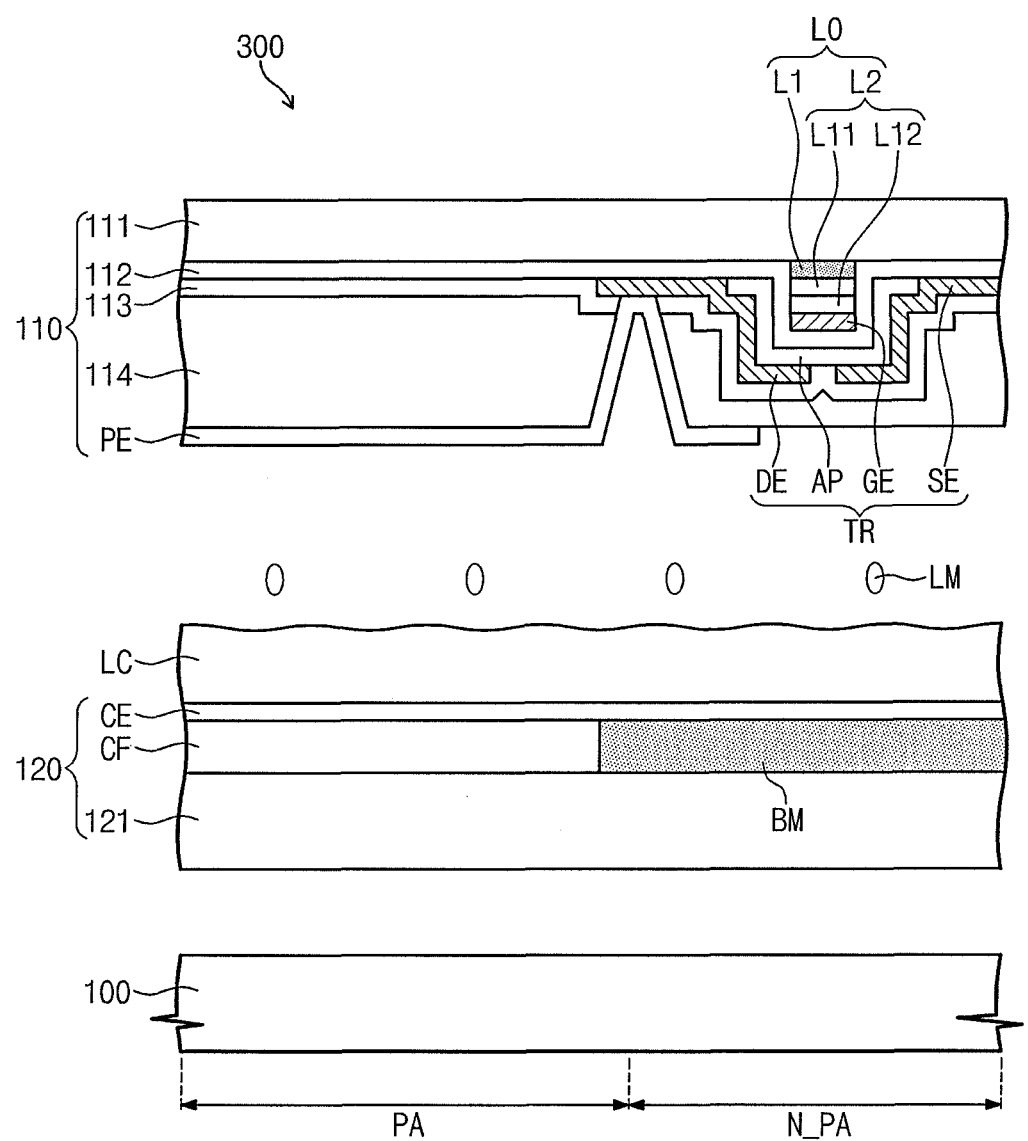

Referring to FIG. 7F, the manufacturing of the display substrate 110 is completed by forming the thin film transistor TR having the gate electrode GE and the pixel electrode being in contact with the thin film transistor TR on the first substrate 111.

Also, the opposite substrate 120 is manufactured by forming the color filter CF, the light shielding layer BM and the common electrode CE on the second substrate 121, and liquid crystals are provided onto the opposite substrate 120. Then, the opposite substrate 120 is bonded to the display substrate 100. There is the liquid crystal layer LC including the liquid crystals LMs between the substrates. Then, the first substrate 111 is arranged so that the first substrate 111 is exposed to the external light, and the backlight assembly 100 is arranged under the opposite substrate 120 so that the backlight assembly 100 is adjacent to the opposite substrate rather than the display substrate 110, so the manufacturing of the display apparatus 300 is completed.

According to embodiments of the present invention, the external light is absorbed by the organic layer of the anti-reflective layer and the amount of a reflected light generated by the external light reflected from the display substrate may decrease by using destructive interference induced by the inorganic layer of the anti-reflective layer. Thus, even if the display substrate is exposed to the external light, the anti-reflective layer may prevent the reflected light from becoming mixed with images displayed on the display apparatus. In accordance with embodiments, the anti-reflective layer configuration may inhibit at least part of the external light from reaching the gate electrode to reduce the amount of light reflected from the gate line or gate electrode. The anti-reflective layer configuration may further inhibit the light reflected from the gate line or the gate electrode from being transmitted, and offset the light reflected from the gate line or the gate electrode. Thus, the anti-reflective layer configuration may reduce the reflection of the external light at the gate line or the gate electrode. As a result, the display quality of the display apparatus may be enhanced.

Since the anti-reflective layer may prevent the display quality from becoming decreased due to the reflected light, it is possible to arrange the display substrate in the display apparatus so that the display substrate is exposed to the external light, and instead, it is possible to arrange the opposite substrate facing the display substrate so that the opposite substrate is adjacent to the backlight assembly of the display apparatus. Thus, it is possible to prevent the thin film transistor arranged on the display substrate from becoming exposed for a long time to light output from the backlight assembly of the display apparatus, and as a result, it is possible to prevent the operation characteristics of the thin film transistor from becoming decreased.

While exemplary embodiments are described above, a person skilled in the art may understand that many modifications and variations may be made without departing from the spirit and scope of the present invention defined in the following claims. Thus, the technical scope of the present invention is not limited to those described in the detailed description but should be defined by the following claims.

What is claimed is:

1. A display apparatus comprising:
   a first substrate exposed to external light;
   a second substrate opposing the first substrate;
   a gate line arranged over the first substrate such that the gate line is located between the first and second substrates; and
   an anti-reflective layer arranged between the first substrate and the gate line to reduce or minimize reflection of the external light at the gate line,
   wherein the anti-reflective layer comprises:
      an organic layer including a light absorber configured to absorb light; and
      an inorganic layer overlapping with the organic layer, wherein the inorganic layer has a refractive index smaller than that of the gate line.

2. The display apparatus of claim 1, wherein the inorganic layer having a thickness sized to cause destructive interference between the light reflected from the gate line and light reflected from the inorganic layer.

3. The display apparatus of claim 2, wherein the organic layer, the inorganic layer, and the gate line are sequentially stacked over the first substrate such that the inorganic layer is located between the organic layer and the gate line.

4. The display apparatus of claim 3, wherein the refractive index of the inorganic layer is greater than that of the organic layer.

5. The display apparatus of claim 4, wherein the inorganic layer comprises a plurality of sub-layers that are stacked over the organic layer and located between the organic layer and the gate line, and
   wherein the plurality of sub-layers comprises a first sub-layer and a second sub-layer located between the first sub-layer and the organic layer, and the amount of the light reflected from the gate line is reduced by destructive interference between the light reflected from the gate line and light reflected from each of the first and second sub-layers.

6. The display apparatus of claim 2, wherein the inorganic layer, the organic layer, and the gate line are sequentially stacked on the first substrate such that the organic layer is located between the inorganic layer and the gate line.

7. The display apparatus of claim 6, wherein the organic layer configured to absorb at least a portion of the external light passing through the inorganic light, and the organic layer configured to absorb the light reflected from the gate line.

8. The display apparatus of claim 1, wherein the organic layer further comprises a heat-resistant material.

9. The display apparatus of claim 8, wherein the light absorber comprises carbon, and the heat-resistant material comprises siloxane.

10. The display apparatus of claim 1, wherein an absorption coefficient of the organic layer is in a range about 0.1 to about 2.0, and each of the organic layer and the inorganic layer has a refractive index in a range of about 1.5 to about 2.0.

11. The display apparatus of claim 1, wherein each of the organic layer and the inorganic layer has a thickness in a range of about 0.01 μm to about 0.50 μm.

12. The display apparatus of claim 1, further comprising a thin film transistor connected electrically to the gate line, wherein the thin film transistor comprises a gate electrode connected electrically to the gate line,
wherein the anti-reflective layer is arranged between the first substrate and the gate electrode to block or minimize light reflected from the gate electrode.

13. The display apparatus of claim 1, further comprising:
a liquid crystal layer arranged between the first substrate and the second substrate; and
a backlight assembly arranged adjacent to the second substrate such that the second substrate is located between the first substrate and the backlight assembly.

14. The display apparatus of claim 1, further comprising:
a first electrode arranged over a pixel area of the first substrate;
an organic emission layer arranged over the first electrode; and
a second electrode arranged over the organic emission layer.

15. A method of manufacturing a display apparatus, the method comprising:
providing a first substrate;
forming an anti-reflective layer over the first substrate;
forming a gate line over the first substrate such that the anti-reflective layer is located between the first substrate and the gate line; and
coupling the first substrate to a second substrate, the first substrate being exposed to external light,
wherein the forming of the anti-reflective layer comprises:
forming an organic layer using a resin, a light absorber and a heat-resistant material; and
forming an inorganic layer that has a refractive index smaller than that of the gate line and overlaps with the organic layer.

16. The method of claim 15, wherein the organic layer absorbs the external light and the light reflected from the gate line, and wherein the inorganic layer causes destructive interference between the light reflected from the gate line and light reflected from the inorganic layer so as to block or minimize an amount of the light reflected from the gate line.

17. The method of claim 16, wherein an absorption coefficient of the organic layer is in a range from about 0.1 to about 2.0, each of the organic layer and the inorganic layer has a refractive index in a range from about 1.5 to about 2.0, and the absorption coefficient and the refractive index are adjusted by adjusting a weight percent (wt %) of the light absorber.

18. The method of claim 16, wherein the organic layer, the inorganic layer, and the gate line are sequentially stacked over the first substrate, and wherein a refractive index of the inorganic layer is greater than that of the organic layer.

19. The method of claim 16, wherein the inorganic layer, the organic layer, and the gate line are sequentially stacked over the first substrate.

20. The method of claim 16, wherein the amount of the heat-resistant material in the organic layer is determined such that the weight reduction ratio of the organic layer at a temperature of 100° C. to 400° C. is 0% to 10%.

* * * * *